United States Patent
Asada et al.

(10) Patent No.: US 7,907,024 B2
(45) Date of Patent: Mar. 15, 2011

(54) RESONANT TUNNELING DIODE OSCILLATION DEVICE AND INSPECTION APPARATUS

(75) Inventors: Masahiro Asada, Zama (JP); Toshihiko Ouchi, Sagamihara (JP); Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/189,914

(22) Filed: Aug. 12, 2008

(65) Prior Publication Data

US 2009/0051452 A1 Feb. 26, 2009

(30) Foreign Application Priority Data

Aug. 20, 2007 (JP) ................... 2007-213644

(51) Int. Cl.
*H03K 3/315* (2006.01)
*H01L 29/88* (2006.01)
(52) U.S. Cl. ................. 331/107 T; 331/179; 372/43.01; 257/25
(58) Field of Classification Search ............... 331/107 T, 331/177 R, 179; 372/28, 29.015, 38.03, 372/43.01; 257/12, 14, 25, 30
See application file for complete search history.

(56) References Cited

U.S. PATENT DOCUMENTS

| | | | | |
|---|---|---|---|---|
| 6,229,153 B1 * | 5/2001 | Botez et al. | ..................... | 257/25 |
| 6,512,370 B1 * | 1/2003 | James | .......................... | 324/253 |
| 2006/0216743 A1 * | 9/2006 | Koo et al. | ......................... | 435/6 |
| 2007/0242625 A1 * | 10/2007 | Dunne et al. | .................. | 370/258 |

FOREIGN PATENT DOCUMENTS

| | | |
|---|---|---|
| JP | 08-116074 | 7/1996 |
| JP | 2007-124250 | 5/2007 |

OTHER PUBLICATIONS

Kishimoto et al., "Frequency Increase of Resonant Tunneling Diode Oscillators in Sub-THz and THz Range Using Thick Spacer Layers", Apr. 2008, Applied Physics Express, vol. 1, 042003.*

Nakagawa et al., "Observation of resonant tunneling in AlGaAs/GaAs tripole barrier diodes", Jul. 1986, Applied Physics Letter, vol. 49, No. 2, pp. 73-75.*

Orihashi et al., "Millimeter and Submillimeter Oscillator Using Resonant Tunneling Diode and Slot Antenna with a novel RF short structure", Sep. 2004, Infrared and Millimeter Waves, 2004 and 12th International Conference on Terahertz Electronics, 2004. Conference Digest of the 2004 Joint 29th International Conference on, pp. 121-122.*

* cited by examiner

*Primary Examiner* — Robert Pascal
*Assistant Examiner* — Ryan Johnson
(74) *Attorney, Agent, or Firm* — Fitzpatrick, Cella, Harper & Scinto

(57) ABSTRACT

An oscillation device has a resonant tunneling diode formed by interposing a gain medium including a first barrier layer, a quantum well layer and a second barrier layer between a first thickness adjusting layer and a second thickness adjusting layer. The oscillation device also has a switch for switching the polarity of a bias voltage being applied to the resonant tunneling diode. The first thickness adjusting layer and the second thickness adjusting layer have different thicknesses. Thus, a single oscillation device is driven to oscillate with different oscillation frequencies.

12 Claims, 8 Drawing Sheets

RESONANT TUNNELING DIODE OSCILLATION DEVICE AND INSPECTION APPARATUS

BACKGROUND OF THE INVENTION

1. Field of the Invention

This invention relates to a current injection type oscillation device using a frequency region from the millimeter wave to the terahertz wave (from 30 GHz to 30 THz). More particularly, the present invention relates to a current injection type oscillation device having a resonant tunneling diode structure.

2. Description of the Related Art

Non-destructive sensing techniques using electromagnetic waves in a frequency region from the millimeter wave to the terahertz wave (from 30 GHz to 30 THz) (to be referred to simply as "terahertz wave" hereinafter) have been and are being developed. In the field of application of electromagnetic waves of this frequency band, safe imaging techniques have been and are being developed for see-through inspection apparatus that can replace X-ray inspection apparatus. Furthermore, spectroscopic technologies for looking into the physical properties including the bonded status of a substance through determination of the absorption spectrum and the complex permittivity of the inside of the substance, biomolecule analyzing techniques and techniques for evaluating the carrier concentration and the mobility are on the way of development.

Additionally, inspection apparatus for inspecting the presence or absence of a substance having an absorption spectrum unique to the terahertz band, or so-called fingerprint spectrum, are in the stage of preliminary development. Such an inspection apparatus can operate quickly and efficiently by discretely providing a plurality of oscillators having oscillation frequencies that are close to the fingerprint spectrum of the object substance of inspection (typically from 0.1 THz to 10 THz) because it does not involve any sweep in the time domain or the frequency domain.

THz wave generating unit include units for generating a pulse wave by irradiating a femtosecond laser beam onto a photoconductive device and parametric oscillation units for generating a wave of a specific frequency by irradiating a nanosecond laser beam onto a nonlinear crystal. However, such units are all of the photoexcitation type that is accompanied by limitations in terms of downsizing and reduction of power consumption rate.

Structures produced by using a quantum cascade laser and a resonant tunneling diode (RTD) are being studied as current injection type devices that operate in the terahertz wave region. Particularly, resonant tunneling diode type devices that are disclosed in Japanese Patent Application Laid-Open No. 2007-124250 and Japanese Patent Application Laid-Open No. H08-116074 are expected to operate at room temperature at or near 1 THz. Such a device is typically formed by a quantum well of InGaAs/InAlAs that is made to grow by epitaxial growth by means of a lattice-aligned system on an InP substrate. It illustrates a negative resistance as illustrated in FIG. 12 of the accompanying drawings for the voltage-current (V-I) characteristic and the oscillation characteristic and is observed to be oscillating near this region.

A planar antenna structure formed on the surface of a substrate as disclosed in Japanese Patent Application Laid-Open No. 2007-124250 is suitably employed as a resonance structure for oscillation. A cavity resonator having a three-dimensional structure is formed in the case of the type disclosed in Japanese Patent Application Laid-Open No. H08-116074. It is a structure where the wall surfaces and the rear surface of the device are also covered by an electrode.

SUMMARY OF THE INVENTION

Generally, the oscillation frequency cannot be changed to a large extent in such semiconductor oscillation devices in the terahertz wave region, so that a large number of oscillation devices having different oscillation frequencies need to be prepared in order to apply such devices to inspections for identifying a substance by means of a fingerprint spectrum in the inside of the substance.

In the case of the antenna resonator type device of Japanese Patent Application Laid-Open No. 2007-124250, a non-doped spacer layer is arranged between the contact layers for establishing contact with the electrodes at the opposite sides of the active layer of the resonant tunneling structure and a depletion layer where no carrier exists is formed in the spacer layer depending on the thickness of the spacer layer. As a voltage is applied to the device for an oscillation operation, the thickness of the depletion layer formed in the spacer layer changes to in turn change the oscillation frequency. However, the change in the oscillation frequency is slight and about several % at most so that such a device cannot accommodate a plurality of spectrums.

The device structure described in Japanese Patent Application Laid-Open No. H08-116074 represents a three-dimensional cavity resonator. Therefore, as well known, while the Q value of the resonator is relatively large and the oscillation frequency changes as the equivalent permittivity of the entire inside changes, a single device cannot produce frequencies that differ to a large extent.

An oscillation device using a resonant tunneling diode in the first aspect of the present invention is characterized by the following features.

It has a resonant tunneling diode formed by interposing a gain medium including a first barrier layer, a quantum well layer and a second barrier layer between a first thickness adjusting layer and a second thickness adjusting layer and a switch for switching the polarity of a bias voltage being applied to the resonant tunneling diode. Additionally, the first thickness adjusting layer and the second thickness adjusting layer have different thicknesses.

An oscillation device in the second aspect of the present invention is characterized by the following features. Namely, it is an oscillation device provided with a gain medium having a gain of an electromagnetic wave, a planar antenna type resonator for confining an electromagnetic wave in the gain medium and a unit for injecting carriers into the gain medium. The gain medium is formed by one or more quantum well layers and a plurality of barrier layers separating the quantum well layers and the transition of carriers among sub-bands of the one or more quantum well layers is based on the resonant tunneling diode where a gain is produced by way of photon assisted tunneling. The unit for injecting carriers includes first and second thickness adjusting layers sandwiched between first and second contact layers made of a semiconductor illustrating conductive properties and the barrier layers, the first thickness adjusting layer and the second thickness adjusting layer having different thicknesses.

An inspection apparatus in the third aspect of the present invention is characterized by inspecting the presence or absence of a substance to be detected by adjusting the oscillation frequency of an oscillation device according to the present invention to a characteristic vibration spectrum of the substance to be detected.

A communication system in the fourth aspect of the present invention is characterized by having communications by means of a frequency-shift keying system, where the frequency of an oscillation device according to the present invention is shifted by way of a unit for switching the polarity of a bias voltage being applied to a resonant tunneling diode in a manner as defined above.

For the purpose of the present invention, the thickness adjusting layer corresponds to a non-doped spacer layer of the prior art. However, the thickness of a depletion layer where no carrier exists is positively adjusted to control the characteristics of the resonant tunneling structure device. By this reason, it is referred to as a thickness adjusting layer. With such an arrangement, the bias point where a negative resistance is generated is changed to shift the oscillation frequency by inverting the polarity of a voltage being applied to the oscillation device relative to the first electrode and the second electrode.

The oscillation wavelength can effectively be shifted when the thickness adjusting layers are within a range not less than 5 nm and not more than 60 nm.

An oscillation device that is capable of oscillating with one of two frequencies can be driven to change the oscillation frequency with time by switching the polarity of the bias voltage and selecting one of the two frequencies.

The present invention can provide an inspection apparatus for inspecting the presence or absence of a substance to be detected by adjusting the oscillation frequency of an oscillation device according to the present invention to a characteristic vibration spectrum of the substance to be detected.

The present invention can provide a compact and low power consumption system including a sensor apparatus or an imaging apparatus that operates in the terahertz region as described in the Related Art section by using an oscillation device according to the present invention.

Thus, a single oscillation device according to the present invention can oscillate in two frequencies. When an inspection apparatus for inspecting the presence or absence of a specific substance by means of the fingerprint spectrum thereof is formed by using oscillation devices according to the present invention, the number of oscillation devices that are employed can be reduced if compared ordinary arrangements where a considerable number of oscillation devices that correspond to various spectrums are required.

Further features of the present invention will become apparent from the following description of exemplary embodiments with reference to the attached drawings.

DETAILED DESCRIPTION OF THE EMBODIMENTS

Figure 1A:
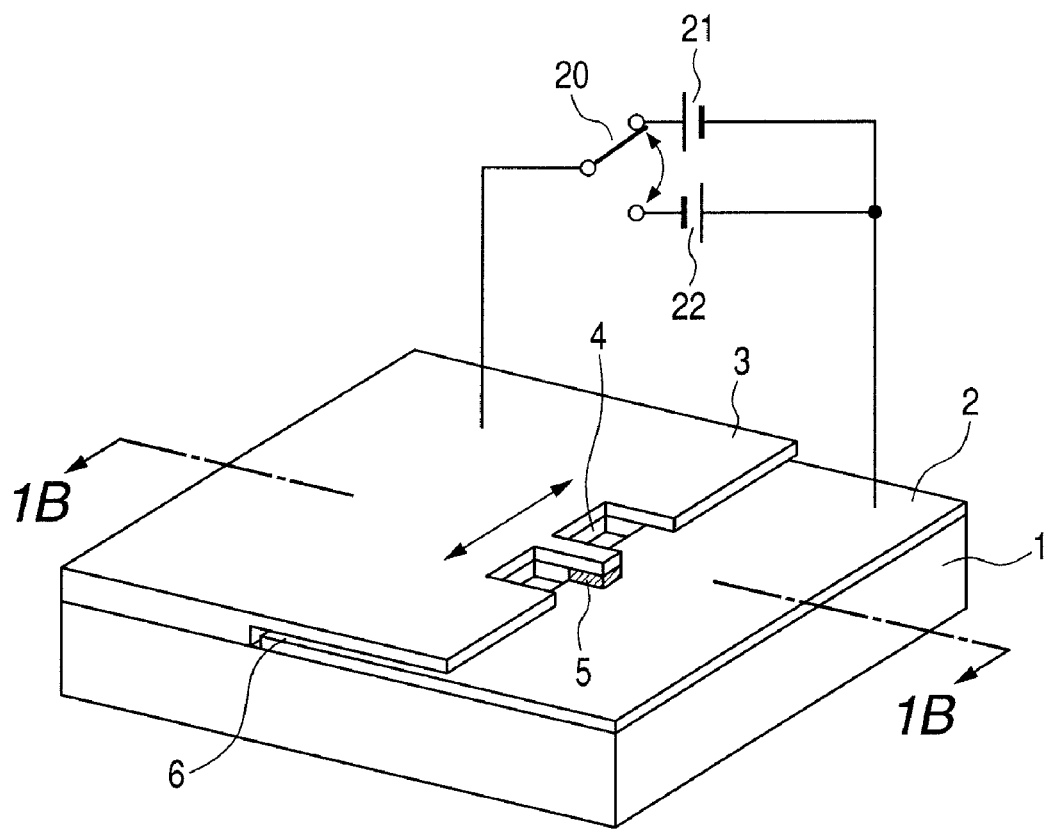
FIGS. 1A and 1B are a schematic perspective view of an oscillation device according to the present invention and a schematic cross-sectional view of the semiconductor part thereof, illustrating the structure thereof.

Now, an oscillation device employing a resonant tunneling diode according to the present invention will be described below. A resonant tunneling diode is employed for the purpose of generating an electromagnetic wave in the terahertz band. The resonant tunneling diode is formed by interposing a gain medium including a first barrier layer, a quantum well layer and a second barrier layer between a first thickness adjusting layer and a second thickness adjusting layer as will be described in greater detail hereinafter by referring to FIGS. 1A and 1B.

An oscillation device according to the present invention has a switch as unit for switching the polarity of the bias voltage being applied to the resonant tunneling diode. Additionally, the first thickness adjusting layer and the second thickness adjusting layer have different thicknesses. With this arrangement, different oscillation frequencies can be output by means of a single oscillation device.

While the thickness of the first and second thickness adjusting layers is not subjected to any particular limitations, it may typically be selected from the range of not less than 5 nm to not more than 100 nm However, the first and second thickness adjusting layers preferably have different thicknesses selected from the range of not less than 5 nm to not more than 60 nm in order to produce a large change in frequency by switching the bias voltage. The difference of thickness between the first thickness adjusting layer and the second thickness adjusting layer is not less than 10 nm, preferably not less than 20 nm, more preferably not less than 40 nm from the viewpoint of securing a large difference of oscillation frequency.

The resonant tunneling diode is provided with a first electrode and a second electrode for the purpose of applying a bias voltage thereto. The switching unit is arranged so as to operate as a unit for changing the oscillation frequency by inverting the polarity of the bias voltage being applied to the resonant tunneling diode for the first electrode and the second electrode.

The gain medium preferably has a plurality of quantum well layers and a barrier layer is arranged between the quantum well layers.

Preferably, the first thickness adjusting layer is arranged between the first barrier layer and the first contact layer and formed as non-doped layer. Similarly, the second thickness adjusting layer is preferably arranged between the second barrier layer and the second contact layer and formed as non-doped layer.

The quantum well layer is formed from a material composed of indium gallium arsenide (InGaAs). The first and second barrier layers are formed from a material composed of aluminum arsenide or indium aluminum arsenide (AlAs, InAlAs). The first and second thickness adjusting layers are typically formed from a material composed of non-doped indium gallium arsenide (InGaAs). The composition ratio of the material of each of the above-listed layers may be appropriately selected.

The switch for switching the polarity of the bias voltage is not subjected to any particular limitations so long as it can invert the polarity of the bias voltage being applied to the resonant tunneling diode. When the polarity of the bias voltage is inverted, the absolute value of the bias voltage before the switching is not necessarily required to be equal to the absolute value of the bias voltage after the switching. For instance, the bias voltage may be gradually shifted from a certain positive voltage value to a certain negative voltage value.

The oscillation device may be provided with an antenna resonator. For example, it may be provided with a planar antenna type resonator for confining an electromagnetic wave in the gain medium having a gain of the electromagnetic wave. The gain medium is formed by one or more quantum well layers and a plurality of barrier layers separating the quantum well layers and the transition of carriers among sub-bands of the one or more quantum well layers is based on the resonant tunneling diode where a gain is produced by way of photon assisted tunneling. A unit for injecting carriers into the gain medium of the resonant tunneling diode is provided. The unit for injecting carriers includes first and second contact layers made of a semiconductor illustrating conductive properties and sandwiched between the first and second thickness adjusting layers and the barrier layers. The first thickness adjusting layer and the second thickness adjusting layer are made to illustrate different thicknesses.

The oscillation frequency of such an oscillation device can be adjusted to the characteristic vibration spectrum of the substance to be detected. Thus, an inspection apparatus for inspecting the presence or absence of the substance to be detected can be formed by using such an oscillation device.

An inspection apparatus may be formed in the following manner. It is formed by using a plurality of oscillators according to the present invention, each having different oscillation frequencies, a plurality of optical systems such as mirrors and lenses for irradiating the electromagnetic wave outputs thereof onto the object of inspection and detectors arranged corresponding to the frequencies of the respective oscillators so as to detect the electromagnetic waves from the object of inspection independently and respectively.

An oscillation device according to the present invention can be used for having communications by means of a frequency-shift keying system, where the frequency of the oscillation device is switched by way of a unit for switching the polarity of the bias voltage being applied to a resonant tunneling diode. Thus, a novel communication system can be formed by employing an oscillation device according to the present invention as light source.

Now, an oscillation device according to the present invention will be described in greater detail by referring to FIGS. 1A and 1B. While the oscillation device is provided with a slot antenna structure in FIGS. 1A and 1B, such an antenna may be provided only when necessary and the antenna is not limited to a slot antenna structure.

Figure 1B:
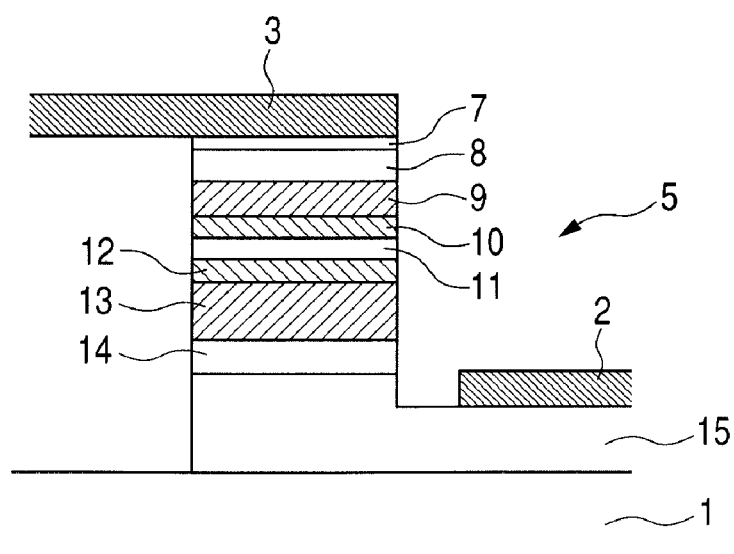

FIGS. 1A and 1B are a schematic perspective view of a THz oscillation device according to the present invention and a schematic cross-sectional view of the semiconductor part thereof, illustrating the structure thereof. Ti/Pd/Au layers 2 and 3 that operate as electrodes and antennas are formed on a substrate 1 with an insulating layer 6 interposed between them. A window region 4 is arranged at the upper electrode 3 by partly removing the electrodes 2 and 3 to produce a slot antenna structure. According to the present invention, a resonator is formed by the slot antenna and the length of the window region as indicated by arrow heads is the factor that determines the oscillation frequency. Reference symbol 5 denotes a semiconductor region formed to illustrate a post-shaped profile. FIG. 1B illustrates a cross-sectional view of the semiconductor region taken along line 1B-1B in FIG. 1A.

The following layers are formed on the semi-insulating InP substrate 1: a first $n^+$-InGaAs contact layer 15, an n-InGaAs layer 14, a first non-doped InGaAs thickness adjusting layer 13, a first non-doped barrier InAlAs layer 12, a non-doped InGaAs quantum well layer 11, a second non-doped InAlAs barrier layer 10, a second non-doped InGaAs thickness adjusting layer 9, an n-InGaAs layer 8 and a second $n^+$-InGaAs layer 7. These layers are typically formed by crystal growth by means of a molecular beam epitaxy apparatus and then by dry etching such as an ICP process so as to make them illustrate a rectangular post-shaping profile with a width of 2.5 nm.

A voltage is applied to these layers by way of the electrodes 2 and 3 that are connected to a power source 21 or 22. An active layer having a double-barrier quantum well structure is formed by the layers 10, 11 and 12 to operate as a resonant tunneling diode having a negative resistance and produce a gain section.

The term "thickness adjusting layer" refers collectively to the non-doped layer part that is sandwiched between the doped layer and the outermost barrier layer that participates in the active layer and is conventionally referred to as a spacer layer. An ordinary spacer layer is arranged to a thickness of 5 nm in order to prevent a dopant from diffusing into the active layer and degrading the quality of the active layer when the crystal is made to grow epitaxially. This is because the traveling speed of carriers falls and the resistance rises when the thickness is too large.

According to the present invention, the thickness adjusting layer refers to an ordinary spacer layer where an adjusting layer is arranged to control a depletion layer. The parasitic capacitance of the device changes because the thickness of the depletion layer changes as a function of the thickness of the collector layer as thickness adjusting layer that takes in carriers, or the side connected to the anode when carriers are electrons.

Figure 2:
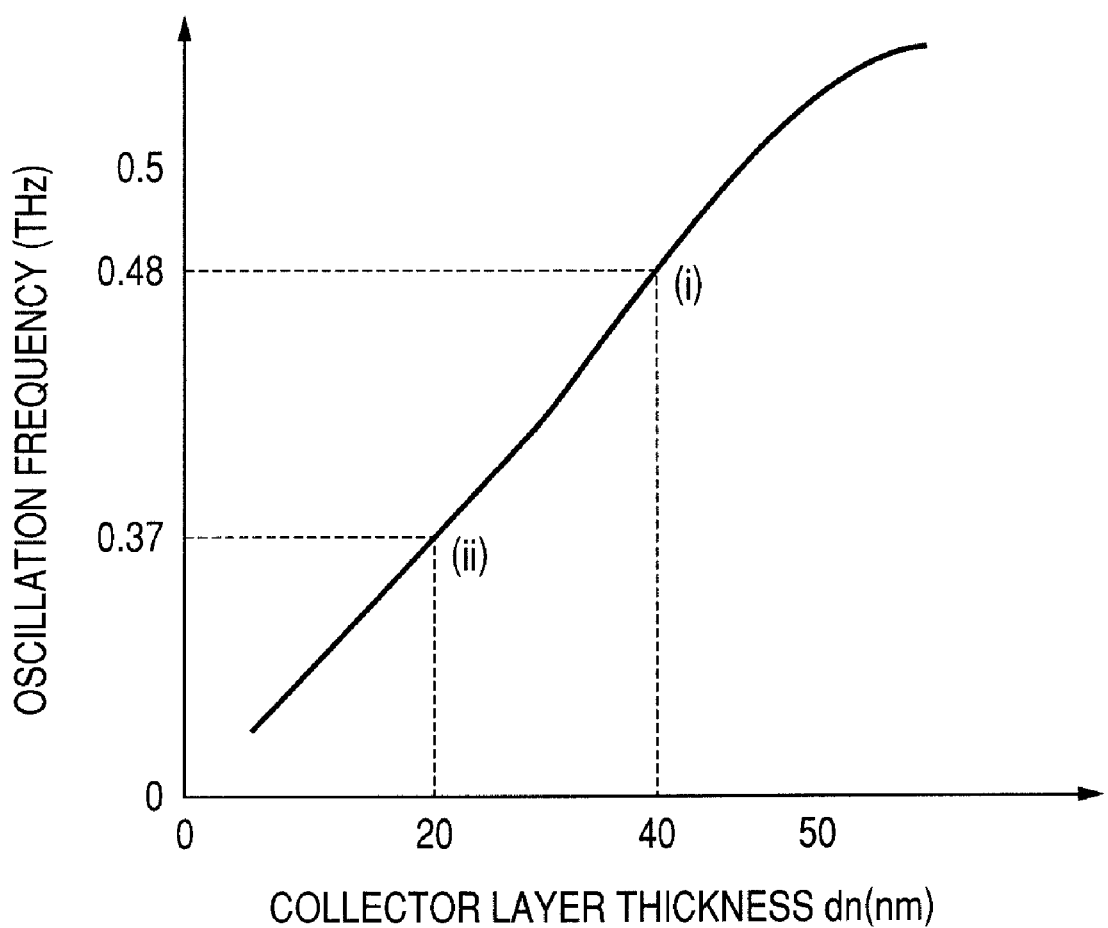
FIG. 2 is a graph illustrating the relationship between the thickness of the collector layer and the oscillation frequency of an oscillation device according to the present invention.
Figure 12:
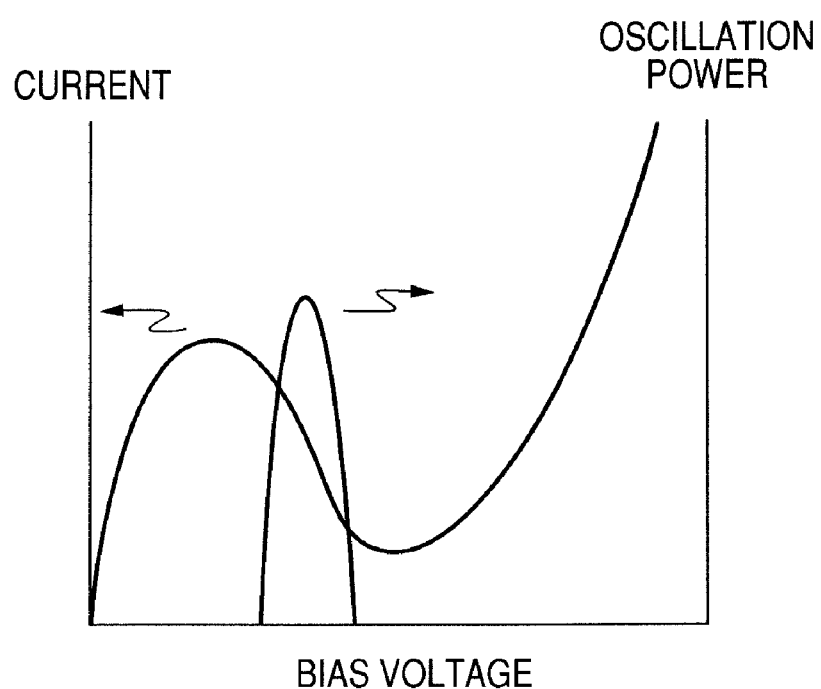
FIG. 12 is a graph illustrating the characteristics of a resonant tunneling diode type oscillation device.

FIG. 2 is a graph illustrating the relationship between the thickness of the collector layer and the oscillation frequency of an oscillation device according to the present invention. In FIG. 2, the assumed device parameters of the device include an antenna length of 50 nm and a peak current density $J_p=200$ kA/cm² for the V-I characteristic as illustrated in FIG. 12. It will be seen that the oscillation frequency remarkably changes from 300 GHz to 550 GHz as the thickness of the collector layer is made to vary from 5 nm to 60 nm When the thickness of the collector layer is made to exceed 60 nm, it no longer provides a region where carriers can be conducted ballistically so that the conduction velocity falls and hence the oscillation frequency cannot be made to vary any further.

As seen from FIG. 2, if the thickness of the thickness adjusting layer at the emitter side where carriers are injected is assumed to be substantially invariable, the oscillation device oscillates with oscillation frequencies of 480 GHz and 370 GHz when the thickness of the thickness adjusting layer at the collector layer side is made to be equal to 40 nm and 20 nm respectively. Thus, if the thickness of the first thickness adjusting layer and that of the second thickness adjusting layer are made to be equal to 40 nm and 20 nm respectively, the thickness adjusting layer that operates as a collector layer is inverted according to the polarity of the voltage being applied to the device. The net result is that a device having a collector layer whose thickness varies is provided and driven to operate. This can be realized by operating the switch 20 for connecting the device to one of the power sources having opposite polarities to another. Alternatively, a power supply unit that can output either with the positive polarity or the negative polarity may be provided to omit the switch.

Figure 3A:
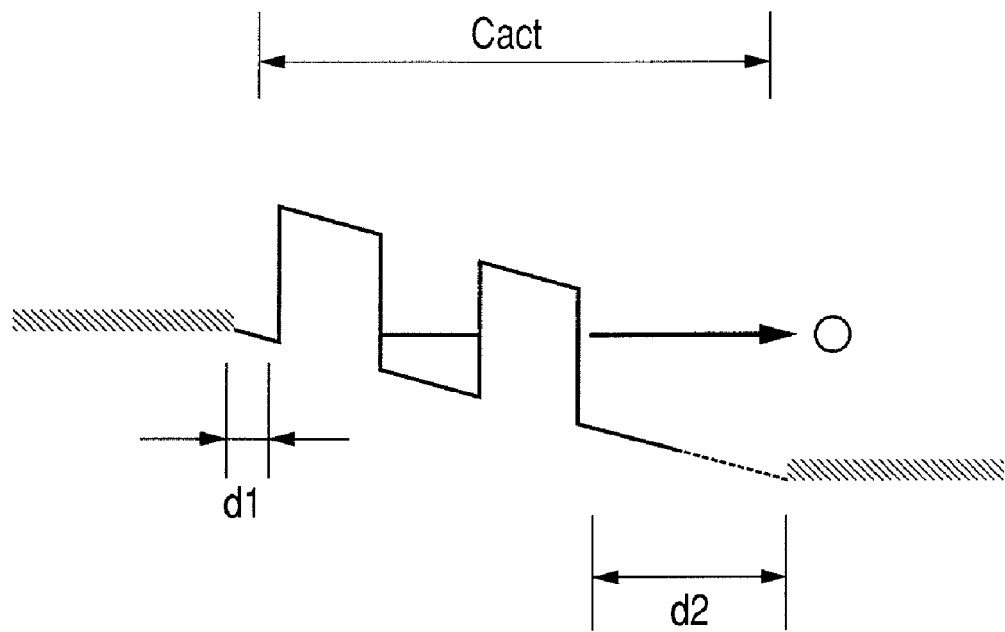
FIGS. 3A and 3B are a schematic illustration of the change of state when the polarity of the bias voltage of an oscillation device according to the present invention is switched.
Figure 3B:
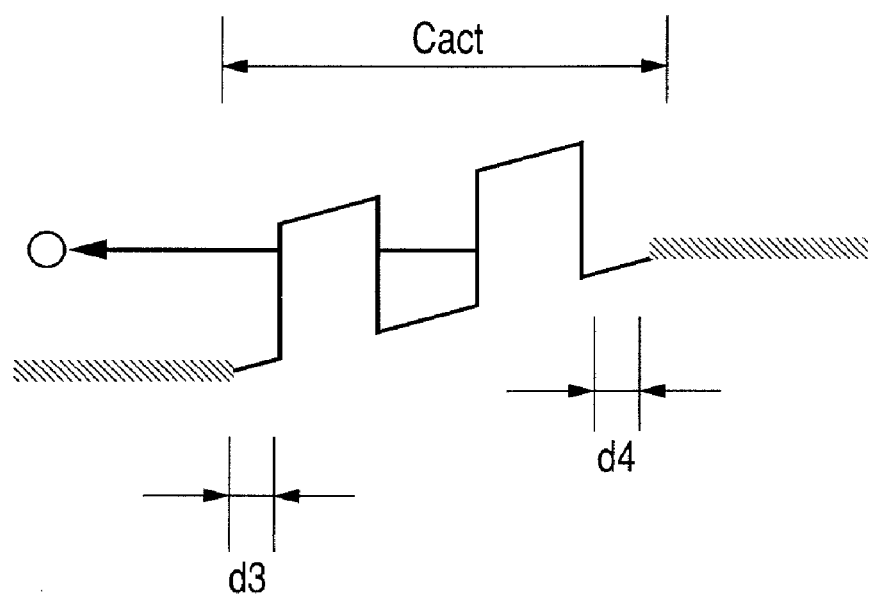

FIGS. 3A and 3B schematically illustrate how the characteristics of an oscillation device changes as a function of the thickness of the collector layer. In FIGS. 3A and 3B, only a conduction band is illustrated on an assumption that carriers are electrons. FIG. 3A illustrates an instance where the first thickness adjusting layer operates as a collector layer with d2=40 nm In this case, the electrode 3 is connected to the cathode while the electrode 2 is connected to the anode and the device oscillates at 480 GHz because the arrangement corresponds to point (i) in FIG. 2. On the other hand, FIG. 3B illustrates an instance where the polarity is inverted and the second thickness adjusting layer operates as a thin collector layer with d3=20 nm Thus, the device oscillates at 370 GHz because the arrangement corresponds to point (ii) in FIG. 2. In this case, carriers diffuse sufficiently at the emitter side and the difference of thickness of the thickness adjusting layer does not have any influence. In other words, d1 and d4 do not illustrate a large difference and, if they do, they do not affect the operation speed. Thus, the oscillation frequency is determined substantially by the thickness of the thickness adjusting layer that operates as a collector layer.

Figure 4:
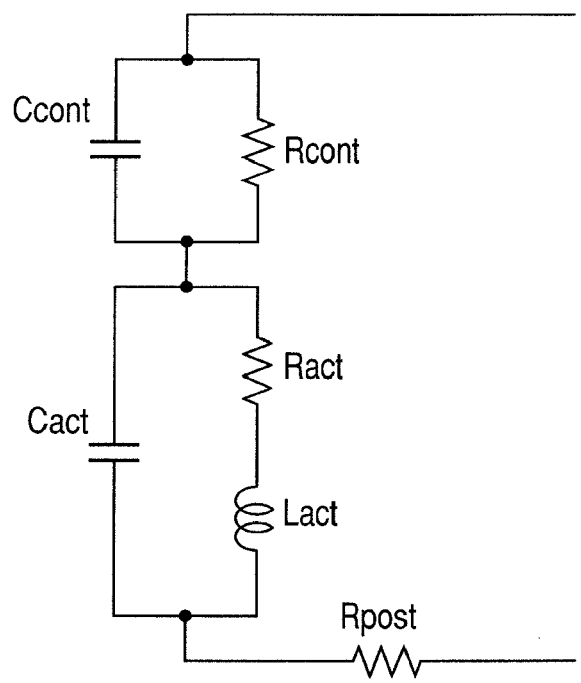
FIG. 4 is a schematic equivalent circuit diagram of the semiconductor part of an oscillation device according to the present invention.

This characteristic can be understood by seeing the equivalent circuit of the resonant tunneling diode illustrated in FIG. 4. In FIG. 4, Ccont and Cact respectively denote the capacity component of the contact layer and that of the active layer and Lact denotes the inductance component of the active layer, whereas Rcont, Rpost and Ract respectively denote the resistance component of the contact layer, that of the post section and that of the active layer. Cact=$\epsilon$S/d in FIGS. 3A and 3B indicates that Cact of the equivalent circuit in FIG. 4 changes to reflect the difference of the thicknesses d2 and d3. As a result, the entire resonance frequency of the same slot antenna type resonator changes and appears as a switch of the oscillation frequency. This can be understood because the Q value of a planar antenna resonator is generally relatively small and a change in the parasitic capacitance of the device is apt to be reflected to a switch of the oscillation frequency.

From the above, a device that oscillates with different frequencies simply can be provided by making the thickness of the first thickness adjusting layer and that of the second thickness adjusting layer asymmetric and inverting the polarity of the bias voltage. While carriers are electrons in the above description, a two-frequency oscillation device that operates in the valence electron band on the same operation principle can be provided by using holes.

Now, the present invention will be described further by way of examples.

Example 1

The first example of the present invention is an oscillation device having a structure as illustrated in FIGS. 1A and 1B with an antenna length of 50 μm and a semiconductor layer 5 forming a resonant tunneling diode and illustrating a post-shaped profile with a width of 2.5 μm. The semiconductor layers forming the device have the respective thicknesses as listed below:

$n^+$-InGaAs contact layer 15: 400 nm;
n-InGaAs layer 14: 50 nm;
first non-doped InGaAs
 thickness adjusting layer 13: 40 nm;
first non-doped AlAs
 barrier layer (In=0) 12: 1.5 nm;
non-doped InGaAs
 quantum well layer 11: 4.5 nm;
second non-doped AlAs
 barrier layer (In=0) 10: 1.5 nm;
second non-doped InGaAs
 thickness adjusting layer 9: 30 nm;
n-InGaAs layer 8: 50 nm; and
a second $n^+$-InGaAs contact layer 7: 20 nm.

Figure 5:
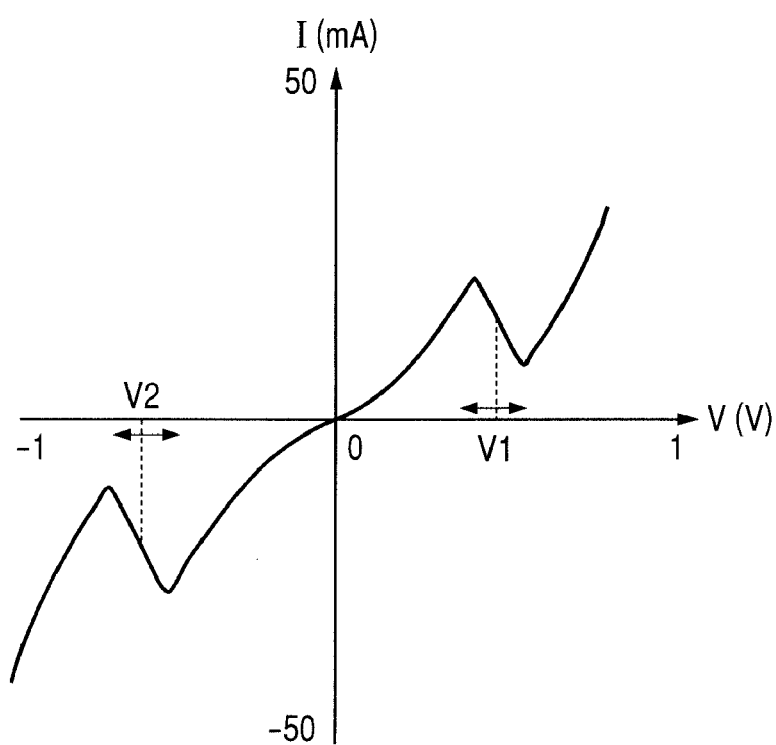
FIG. 5 is a graph illustrating the V-I characteristic of the device of the first example.

FIG. 5 is a graph illustrating the V-I characteristic of the device observed when the device is electrically energized. In the case of FIG. 3A where the thickness adjusting layer having a large thickness is operated as a collector layer, a maximum gain is obtained with V2 at the negative bias side because a higher electric field is required. Conversely, in the case of FIG. 3B, a maximum gain is obtained at the positive bias side. In both cases, the device oscillates near the bias voltage. More specifically, the device oscillates at 370 GHz with V1=0.4 V and at 480 GHz with V2=−0.5 V.

As V1 and V2 are made to vary in a region where a negative resistance is generated and hence a gain exists as indicated by arrow heads in FIG. 5, the oscillation wavelength can be made to change slightly (by about several %) because the thickness of the depletion layer in the same collector layer changes slightly. Therefore, the oscillation frequency of 370 GHz can be made variable by about ±10 GHz while the oscillation device is driven to oscillate at that frequency. Similarly, the oscillation frequency of 480 GHz can be made variable by about ±10 GHz while the oscillation device is driven to oscillate at that frequency.

To actually switch the oscillation frequency, V1 or V2 may be selected by the switch 20 arranged at the power sources 21 and 22 as illustrated in FIG. 1A. The bias voltage may be lowered gradually to 0 and then raised again after switching the polarity to drive the oscillation device in order to protect the device. Alternatively, the two frequencies may be switched quickly for FSK (frequency-shift keying) modulation so as to drive the device to operate as light source for communications in a sub-THz band.

Example 2

Figure 6:
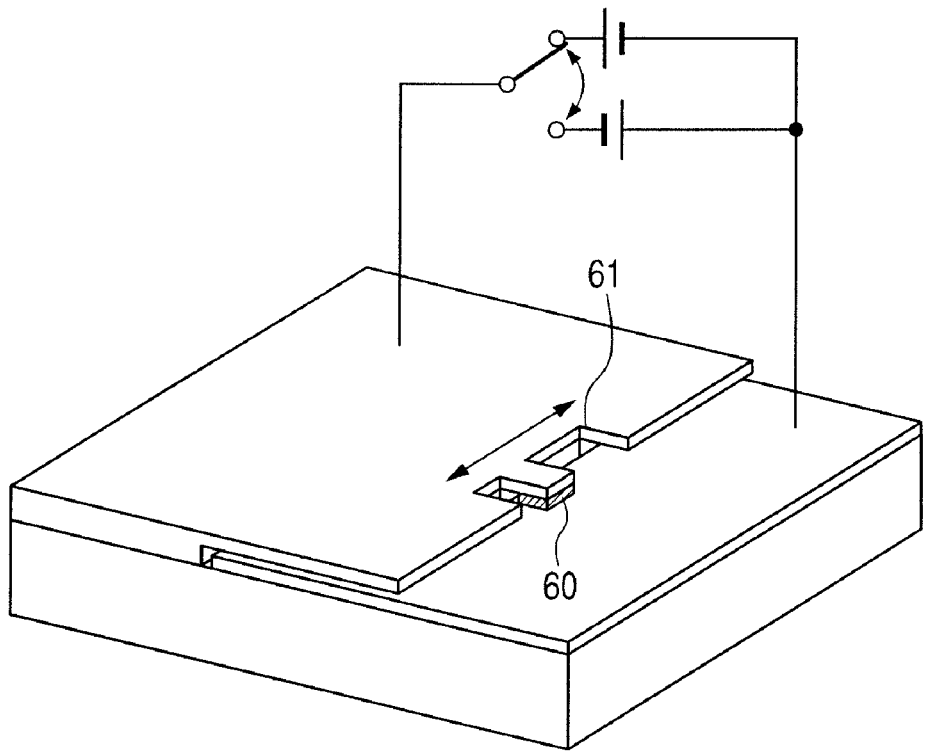
FIG. 6 is a schematic perspective view of the oscillation device of the second example.

In the second example of the present invention, the semiconductor post 60 that forms a resonant tunneling diode is arranged not at the center of the window region 61 for forming a slot antenna but at a position slightly shifted from the center as illustrated in FIG. 6.

With this arrangement, the oscillation frequencies can be raised further. When a structure same as that of Example 1 is employed and the semiconductor post 60 is arranged at a position displaced by 15 μm from the central position, each of the oscillation frequencies can be raised by about 20% and the width of the two frequency oscillation can be adjusted so as to make it broader.

Example 3

In the third example of the present invention, the oscillation frequencies are adjusted by changing the longitudinal length of the resonator, or the slot antenna in FIG. 1A.

Figure 7:
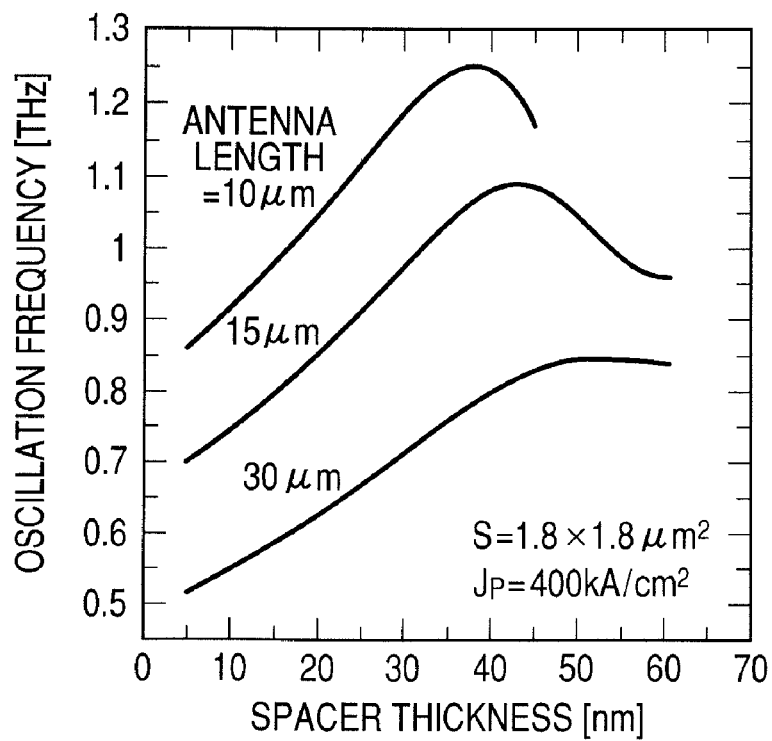
FIG. 7 is a graph illustrating computation examples for designing the oscillation frequencies of the oscillation device of the third example.

FIG. 7 is a graph illustrating computation examples for designing the oscillation frequencies of the oscillation device of this example. It illustrates the oscillation frequencies corresponding to the thickness of the thickness adjusting layer that operates as collector when the antenna length is reduced to 30 μm, 15 μm and 10 μm. Note that the semiconductor layer 5 is a post with a width of 1.8 nm and the peak current density is 400 kA/cm².

Then, if the antenna length is 30 nm and the thicknesses of the thickness adjusting layers are 40 nm and 20 nm, it will be seen that two oscillation frequencies of 610 GHz and 770 GHz are available. Similarly, a desired two-frequency oscillation device can be provided by selecting desired oscillation frequencies from FIG. 7.

An oscillation device according to the present invention can be made to oscillate at frequencies higher than those of Examples 1 and 2 by reducing the width of the post and the antenna length.

Example 4

In the fourth example of the present invention, the antenna length of the slot antenna of FIG. 1A is made equal to 30 μm while the semiconductor layer 5 is formed as a 2.3 μm wide post and a resonant tunneling diode having a triple barrier quantum well is employed. The semiconductor layers forming the device have the respective thicknesses as listed below:
non-doped InGaAs
  thickness adjusting layer 90: 40 nm;
non-doped AlAs barrier layer 91: 1.3 nm;
non-doped InGaAs
  quantum well layer 92: 7.6 nm;
non-doped InAlAs bather layer 93: 2.6 nm;
non-doped InGaAs
  quantum well layer 94: 5.6 nm;
non-doped AlAs barrier layer 95: 1.3 nm; and
non-doped InGaAs
  thickness adjusting layer 96: 20 nm.

Note that the above-listed thicknesses are only examples and the present invention is by no means limited thereto.

Figure 8:
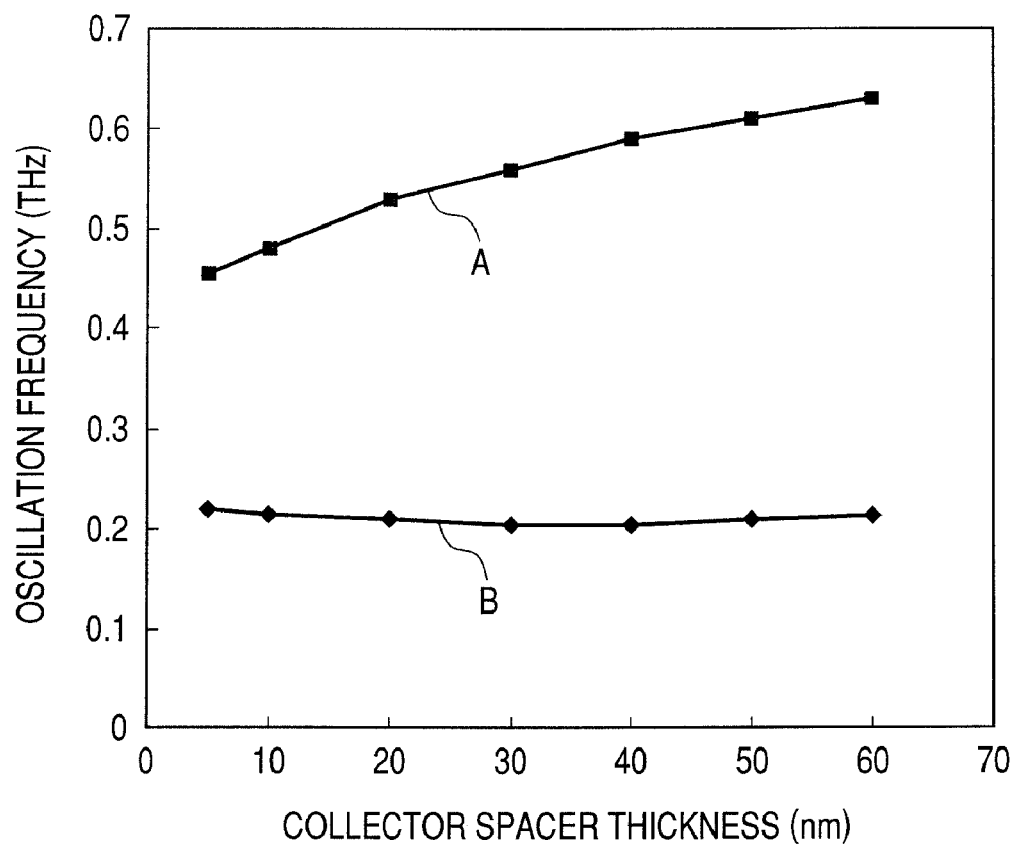
FIG. 8 is a graph illustrating computation examples for designing the oscillation frequencies of the oscillation device of the fourth example.
Figure 9:
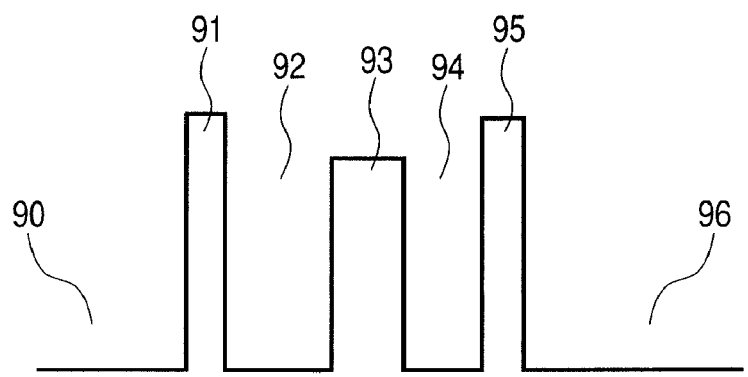
FIG. 9 is a schematic illustration of the structure of the active layer of the oscillation device of the fourth example.

FIG. 8 is a graph illustrating design examples for designing the oscillation frequencies of the oscillation device of the Example 4. In FIG. 8, B denotes the oscillation frequency dependency of the thickness adjusting layer at the collector side when a 5.6 nm quantum well layer 94 is at the emitter side and A denotes the oscillation frequency dependency of the thickness adjusting layer at the collector side when a 7.6 nm quantum well layer 92 is at the emitter side. From the graph, the oscillation frequency can be made equal to 590 GHz when the 40 nm thickness adjusting layer is at the collector side, and equal to 210 GHz when the 20 nm thick adjusting layer is at the collector side. The peak current densities for them are respectively 90 kA/cm² and 280 kA/cm². In this way, an oscillation device of the triple barrier layer type can raise the frequency difference when compared with a device of the double barrier layer type.

While the above-described devices employ a slot antenna as antenna resonator, antenna of some other structure such as a patch antenna or dipole antenna may alternatively be employed.

Additionally, oscillation devices are described in the above examples, a similar arrangement can be used to detect an electromagnetic wave incoming from outside with a high sensitivity by adjusting the bias voltage to the state immediately before oscillation in advance. With such an arrangement, the incoming electromagnetic wave can be detected with a high sensitivity only when it has a frequency close to the oscillation frequency of the device. In other words, such an arrangement can be operated as a detector equipped with a band frequency filter. Additionally, two different frequencies can be detected by switching the polarity of the bias voltage.

Example 5

The fifth example provides an inspection apparatus for inspecting an object that employs an oscillation device according to the present invention.

Figure 10:
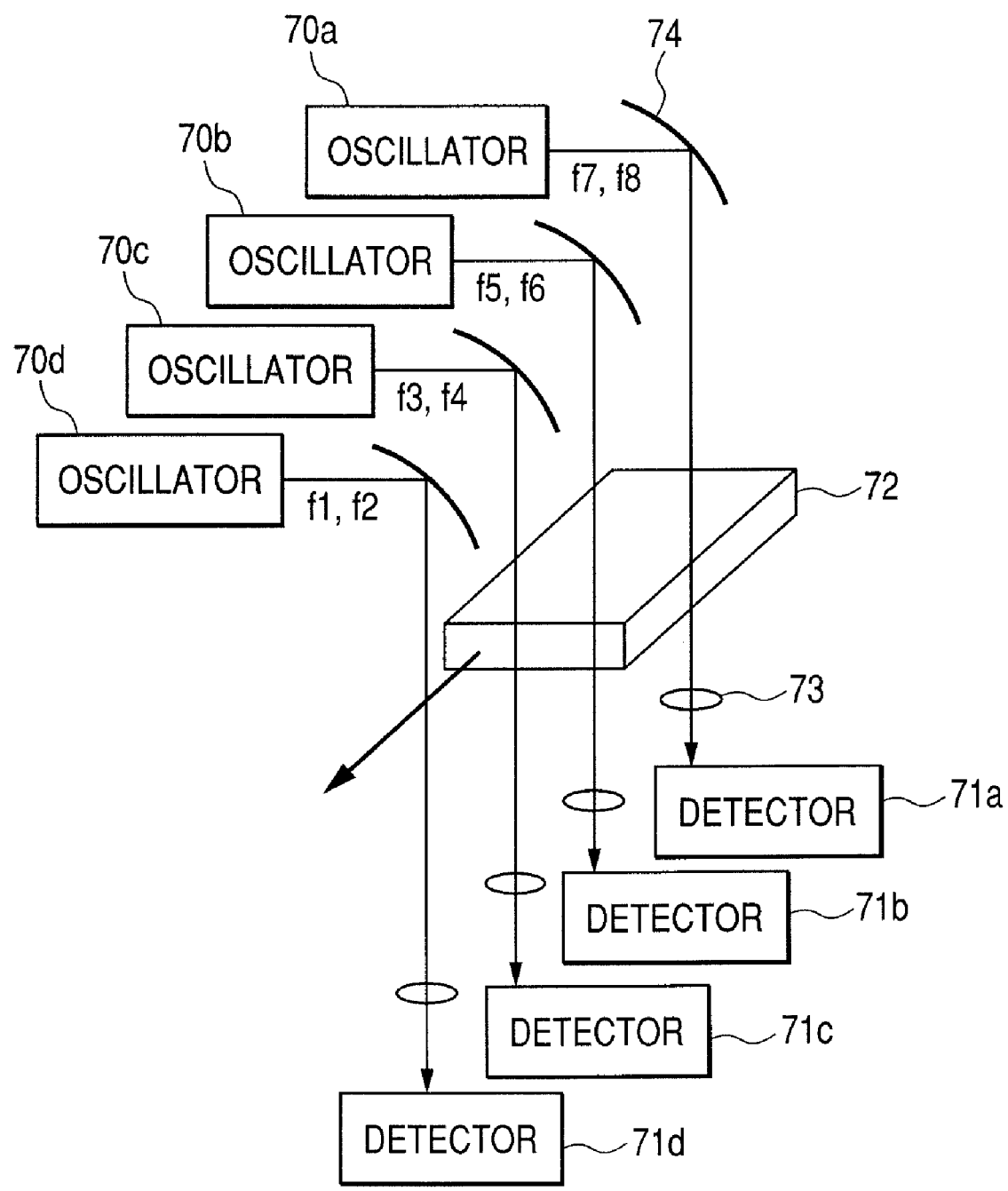
FIG. 10 is a schematic illustration of the inspection apparatus of the fifth example.

As illustrated in FIG. 10, a plurality of oscillation frequencies f1 through f8 are produced by means of oscillators 70a through 70d according to the present invention, each of which oscillates in two frequencies. Each of the electromagnetic waves is made to propagate as a collimated beam by means of a parabolic mirror 74. Beams of light irradiated onto and transmitted through the object 72 of inspection are collected and received by respective detectors 71a through 71d. While the detectors are arranged to receive transmitted beams of light in this example, detectors may alternatively be so arranged as to receive reflected beams of light.

If the substance to be detected illustrates one or more specific absorption spectrums for the frequencies f1 through f8, if the object 72 of inspection contains the substance or not can be determined by making the inspection apparatus store patterns of combination of different intensities in advance.

Figure 11:
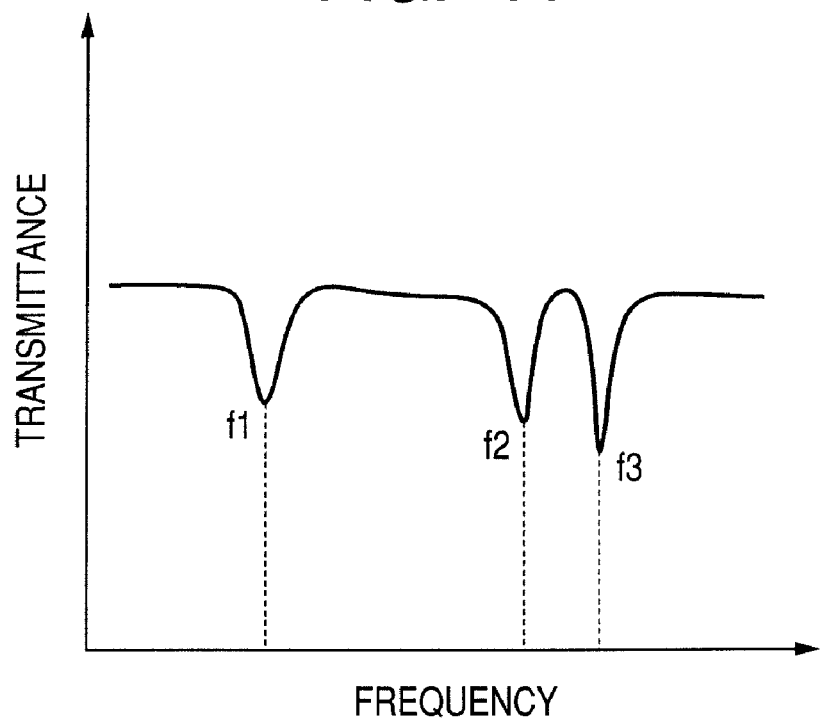
FIG. 11 is a graph schematically illustrating an exemplary transmission spectrum of a substance to be detected.

FIG. 11 is a graph schematically illustrating an exemplary fingerprint spectrum of a substance to be detected. The substance illustrates absorption peaks at frequencies f1, f6 and f7. Therefore, if the absorption pattern of the substance to be detected is stored in the inspection apparatus in advance and collated with the information that the detected absorption pattern illustrates weak output levels at f1, f6 and f7 but strong output levels at other frequencies, the substance to be detected is contained in the object of inspection.

Such an inspection apparatus can find applications in the field of detection of hazardous and prohibited substances in airports, in the field of inspection of items being distributed by post or as freights and in the field of inspection of industrial products at manufacturing plants.

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-213644, filed on Aug. 20, 2007, which is hereby incorporated by reference herein in its entirety.

What is claimed is:

1. An oscillation device using a resonant tunneling diode comprising:
   a resonant tunneling diode formed by interposing a gain medium including a first barrier layer, a quantum well layer and a second barrier layer between a first thickness adjusting layer and a second thickness adjusting layer; and
   a switch for switching polarity of a bias voltage being applied to the resonant tunneling diode,
   the first thickness adjusting layer and the second thickness adjusting layer having different thicknesses.

2. The device according to claim 1, wherein the thicknesses of the first and second thickness adjusting layers are not less than 5 nm and not more than 60 nm.

3. The device according to claim 1, further comprising a first electrode and a second electrode for applying the bias voltage to the resonant tunneling diode, the switch being adapted to switch oscillation frequency of the oscillation device by inverting the polarity of the bias voltage being applied to the resonant tunneling diode relative to the first electrode and the second electrode.

4. The device according to claim 1, wherein the gain medium includes a plurality of quantum well layers and a further barrier layer is interposed between the quantum well layers.

5. The device according to claim 3, wherein the first thickness adjusting layer is a non-doped layer arranged between the first barrier layer and the first electrode and the second thickness adjusting layer is a non-doped layer arranged between the second barrier layer and the second electrode.

6. The device according to claim 1, wherein the quantum well layer is made of a material containing indium gallium arsenide and the first and second barrier layers are made of a material containing aluminum arsenide or indium aluminum arsenide, while the first and second thickness adjusting layers are made of a material containing non-doped indium gallium arsenide.

7. The device according to claim 1, further comprising an antenna resonator.

8. An inspection apparatus for inspecting the presence or absence of a substance to be detected by adjusting the oscillation frequency of an oscillation device according to claim 1 to a characteristic vibration spectrum of the substance to be detected.

9. A communication system adapted to have communications by means of a frequency-shift keying system, where an oscillation device according to claim 1 is employed as a light source and the oscillation device is subjected to frequency switching.

10. An oscillation device for oscillating electromagnetic waves with first and second frequencies, the first and second frequencies being different from each other, said oscillation device comprising:
   a resonant tunneling diode; and
   a resonator,
   wherein the resonant tunneling diode includes a gain medium and first and second adjusting layers sandwiching the gain medium, the gain medium having a quantum well layer and first and second barrier layers sandwiching the quantum well layer, the first and second adjusting layers having different thicknesses, and
   wherein the resonator is so constructed that the oscillation device oscillates an electromagnetic wave with the first frequency generated by the resonant tunneling diode when the first adjusting layer has an electric potential higher than the second adjusting layer and the oscillation device oscillates an electromagnetic wave with the second frequency generated by the resonant tunneling diode when the second adjusting layer has an electric potential higher than the first adjusting layer.

11. An oscillation device for oscillating electromagnetic waves, comprising:
   a resonant tunneling diode; and
   a switch for switching polarity of a voltage being applied to the resonant tunneling diode,
   wherein the resonant tunneling diode includes a gain medium and first and second adjusting layers sandwiching the gain medium, the gain medium having a quantum well layer and first and second barrier layers sandwiching the quantum well layer, the first and second adjusting layers having different thicknesses, and
   wherein the electromagnetic waves have different frequencies depending on the polarity of a voltage applied between the first and second adjusting layers, the polarity being switched by the switch.

12. A resonant tunneling diode to be used for an oscillation device having a switch for switching polarity of a voltage being applied to the resonant tunneling diode, said resonant tunneling diode comprising:
   a gain medium having a quantum well layer and first and second barrier layers sandwiching the quantum well layer; and
   first and second adjusting layers sandwiching the gain medium,
   wherein the first and second adjusting layers have different thicknesses from each other so that the oscillation device oscillates electromagnetic waves having different frequencies depending on the polarity of a voltage applied between the first and second adjusting layers, the polarity being switched by the switch.

* * * * *